United States Patent
Duane et al.

(10) Patent No.: US 6,727,558 B1
(45) Date of Patent: Apr. 27, 2004

(54) CHANNEL ISOLATION USING DIELECTRIC ISOLATION STRUCTURES

(75) Inventors: Michael P. Duane, Santa Clara, CA (US); David D. Wu, Austin, TX (US); Massud Aminpur, Dresden (DE); Scott D. Luning, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/784,790

(22) Filed: Feb. 15, 2001

(51) Int. Cl.[7] .............................................. H01L 21/425
(52) U.S. Cl. ...................... 257/377; 257/374; 257/510; 257/382
(58) Field of Search ................................ 438/585, 294, 438/296; 257/345

(56) References Cited

U.S. PATENT DOCUMENTS

| | | | | |
|---|---|---|---|---|
| 6,083,796 A | * | 7/2000 | Park et al. | 438/294 |
| 6,190,981 B1 | * | 2/2001 | Lin et al. | 438/305 |
| 6,383,877 B1 | * | 5/2002 | Ahn et al. | 438/296 |

* cited by examiner

*Primary Examiner*—Wael Fahmy
*Assistant Examiner*—Anh Duy Mai
(74) *Attorney, Agent, or Firm*—Williams, Morgan & Amerson

(57) ABSTRACT

A method is provided, the method including forming a gate dielectric above a substrate layer, and forming a gate conductor above the gate dielectric. The method also includes forming at least one dielectric isolation structure in the substrate adjacent the gate dielectric.

26 Claims, 14 Drawing Sheets

CHANNEL ISOLATION USING DIELECTRIC ISOLATION STRUCTURES

BACKGROUND OF THE INVENTION

1. Field of the Invention

This invention relates generally to semiconductor fabrication technology, and, more particularly, to a semiconductor device, and a method of forming the semiconductor device.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. All other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the channel length of a transistor also increases "short-channel" effects, almost by definition. Short-channel effects include, among other things, an increased drain-source leakage current when the transistor is supposed to be switched "off," believed to be due to an enlarged depletion region relative to the shorter channel length. Short-channel effects also include threshold voltage ($V_t$) rolloff (the rapid decrease in the threshold voltage $V_t$ for small changes in channel length $\Lambda$), and large differences in the threshold voltage in the linear region $V_{tlin}$ and the threshold voltage in the saturation region $V_{tsat}$ (DIBL), so that $V_t$ is a strong function of the drain-source voltage $V_{ds}$.

Short-channel effects may be reduced by using angled halo implants. Angled halo implants are implants of dopants that effectively "reinforce" the doping type of the substrate in the channel between the source/drain extension (SDE) regions (formerly known as lightly doped drain or LDD regions). For example, for an N-MOS transistor, the doping type of the substrate in the channel between the N⁻ source/drain extension (SDE) regions is p-type. The angled halo implant may be boron (B) or boron difluoride ($BF_2$) implanted into the substrate at an angle (with respect to a direction perpendicular to the surface of the substrate), and with a dose that may range from about $1.0 \times 10^{12}$–$1.0 \times 10^{14}$ ions/cm² at an implant energy ranging from about 5–15 keV for B and about 20–70 keV for $BF_2$.

Similarly, for a P-MOS transistor, the doping type of the substrate in the channel between the P⁻ source/drain extension (SDE) regions is n-type. The angled halo implant may be arsenic (As) implanted into the substrate at an angle (with respect to a direction perpendicular to the surface of the substrate), and with a dose that may range from about $1.0 \times 10^{12}$–$1.0 \times 10^{14}$ ions/cm² at an implant energy ranging from about 40–70 keV for As.

Moreover, reducing short-channel effects by using angled halo implants does not solve the problems associated with the increased contact and series resistances of active areas, such as N⁺ (P⁺) source/drain regions and a doped-polycrystalline silicon (doped-polysilicon or doped-poly) gate conductor. Reducing the channel length of a transistor also requires reducing the size and area of electrical contacts to the active areas. As the size and area of the electrical contacts to the active areas get smaller, the active area contact and series resistances increase. Increased active area contact and series resistances are undesirable for a number of reasons. For example, increased active area contact and series resistances may reduce device drive current, and source/drain current through the device, and may also adversely affect the overall speed and operation of the transistor.

Typically, depositing titanium (Ti) or cobalt (Co) on the active area electrical contacts may decrease active area contact and series resistances. The Ti may then be silicided by annealing with a heat-treatment to form titanium silicide ($TiSi_2$) at the active area electrical contacts (self-aligned silicidation or salicidation). The salicided $TiSi_2$ lowers active area contact resistance.

Nevertheless, effective salicidization may require the formation of deeper N⁺ (P⁺) source/drain regions and/or deeper source/drain extension (SDE) regions. However, conventional techniques of forming deeper N⁺ (P⁺) source/drain regions and/or deeper source/drain extension (SDE) regions typically increase undesirable short-channel effects such as increased drain-source leakage current.

The present invention is directed to overcoming, or at least reducing the effects of, one or more of the problems set forth above.

SUMMARY OF THE INVENTION

In one aspect of the present invention, a method is provided, the method including the method including forming a gate dielectric above a substrate layer, and forming a gate conductor above the gate dielectric. The method also includes forming at least one dielectric isolation structure in the substrate adjacent the gate dielectric.

In another aspect of the present invention, a semiconductor device is provided, formed by a method including forming a gate dielectric above a substrate layer, and forming a gate conductor above the gate dielectric. The method also includes forming at least one dielectric isolation structure in the substrate adjacent the gate dielectric.

In yet another aspect of the present invention, a semiconductor device is provided including a gate dielectric above a substrate layer, and a gate conductor above the gate dielectric. The semiconductor device also includes at least one dielectric isolation structure in the substrate adjacent the gate dielectric.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
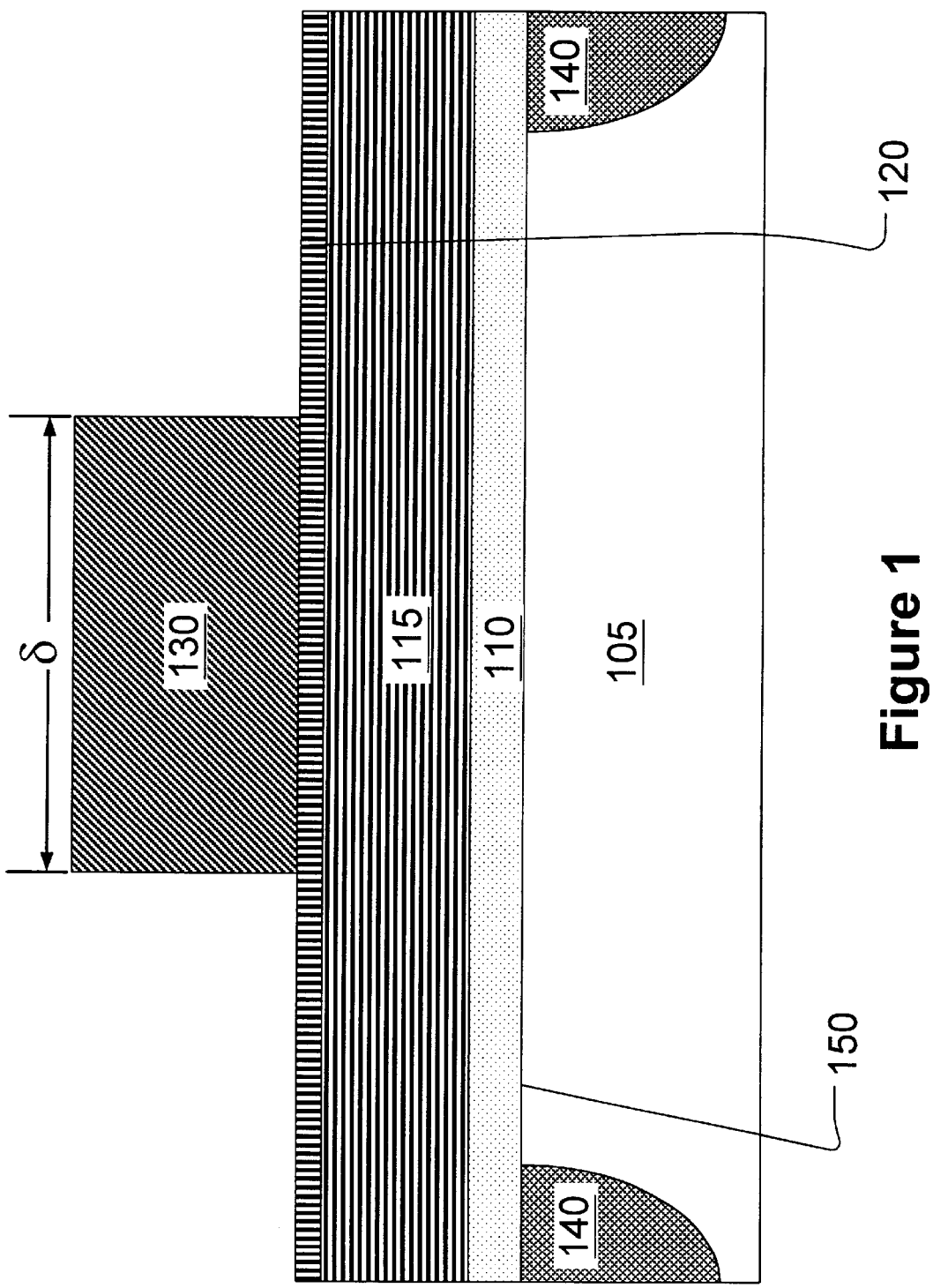
FIGS. 1–14 illustrate schematically in cross-section various embodiments of a method for semiconductor device fabrication according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–14. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

FIGS. 1–14 illustrate a method of forming an MOS transistor 1400 (FIG. 14) according to the present invention. As shown in FIG. 1, a dielectric layer 110 may be formed above an upper surface 150 of a semiconducting substrate 105, such as doped-silicon. The dielectric layer 110 may be formed by a variety of known techniques for forming such layers, e.g., chemical vapor deposition (CVD), low-pressure CVD (LPCVD), plasma-enhanced CVD (PECVD), sputtering and physical vapor deposition (PVD), thermal growing, and the like. The dielectric layer 110 may have a thickness above the upper surface 150 ranging from approximately 10–100 Å, for example, and may be formed from a variety of dielectric materials and may, for example, be an oxide (e.g., Ge oxide), an oxynitride (e.g., silicon oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The dielectric layer 110 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. The dielectric layer 110 may have an equivalent oxide thickness $t_{ox-eq}$ ranging from approximately 10–100 Å, for example. An equivalent oxide thickness $t_{ox-eq}$ may be defined to be the thickness t of a dielectric material (with a dielectric constant K) that would have a capacitance per unit area C that is approximately the same as the capacitance per unit area $C_{ox}$ that a thickness $t_{ox-eq}$ of silicon dioxide ($SiO_2$) would have. Since $SiO_2$ has a dielectric constant $K_{ox}$ of approximately 4, and since $C=K/t$ and $C_{ox}=K_{ox}/t_{ox-eq}$, then $t=K/C=K/C_{ox}=Kt_{ox-eq}/K_{ox}=Kt_{ox-eq}/4$, approximately. For example, the dielectric layer 110 may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}$ and $t=K_{TaO}t_{ox-eq}/K_{ox}=24t_{ox-eq}/4$, approximately, an equivalent oxide thickness $t_{ox-eq}$ ranging from approximately 10–100 Å would correspond to a $Ta_2O_5$ thickness $t_{TaO}$ ranging from approximately 60–600 Å.

As shown in FIG. 1, a conductive layer 115 may be formed above the dielectric layer 110. The conductive layer 115 may be formed by a variety of known techniques, e.g., high-density ionized metal plasma (IMP) deposition, high-density inductively coupled plasma (ICP) deposition, sputtering, PVD, CVD, LPCVD, PECVD, and the like, and may have a thickness ranging from approximately 500–5000 Å. The conductive layer 115 may be formed of a variety of metals such as aluminum (Al), titanium (Ti), zirconium (Zr), tungsten (W), tantalum (Ta), nickel (Ni), molybdenum (Mo), cobalt (Co), and the like.

In various alternative illustrative embodiments, the conductive layer 115 may be a doped-poly conductive layer 115. The doped-poly conductive layer 115 may be formed by a variety of known techniques for forming such layers, e.g., CVD, LPCVD, PECVD, PVD, and the like, and may have a thickness ranging from approximately 1000–3000 Å. In one illustrative embodiment, the doped-poly conductive layer 115 has a thickness of approximately 2000 Å and is formed by an LPCVD process for higher throughput.

The doped-poly conductive layer 115 may be doped with arsenic (As) for an NMOS transistor, for example, or boron (B) for a PMOS transistor, to render the poly more conductive. The poly layer 115 may be formed undoped, by an LPCVD process for higher throughput, to have a thickness ranging from approximately 1000–3000 Å, for example. The doping of the poly layer 115 may conveniently be accomplished by diffusing or implanting the dopant atoms and/or molecules through the upper surface of the poly. The doped-poly conductive layer 115 may then be subjected to a heat-treating process that may be a rapid thermal anneal (RTA) process performed at a temperature ranging from approximately 800–1100° C. for a time ranging from approximately 5–60 seconds.

As shown in FIG. 1, an optional antireflective coating (ARC) layer 120 may be formed above the conductive layer 115, and a patterned photoresist mask 130 may be formed above the optional antireflective coating (ARC) layer 120. As shown in FIG. 1, the patterned photoresist mask 130 may have a smallest, diffraction-limited dimension δ that may be in a range of about 1000–2000 Å. In various alternative illustrative embodiments (not shown) in which the optional antireflective coating (ARC) layer 120 is not used, the patterned photoresist mask 130 may be formed directly on the conductive layer 115.

As shown in FIG. 1, shallow trench isolation (STI) regions 140 formed of suitable dielectric materials may be provided to isolate the MOS transistor 1400 (FIG. 14) electrically from neighboring semiconductor devices such as other MOS transistors (not shown). The shallow trench isolation (STI) regions 140 may, for example, include an oxide (e.g., Ge oxide), an oxynitride (e.g., silicon oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The shallow trench isolation (STI) regions 140 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the shallow trench isolation (STI) regions 140 may also be formed of any suitable "low dielectric constant" or "low K" dielectric material, where K is less than or equal to about 4. Examples include Applied Material's Black Diamond®, Novellus' Coral®, Allied Signal's Nanoglass®, JSR's LKD5104, and the like.

Figure 2:
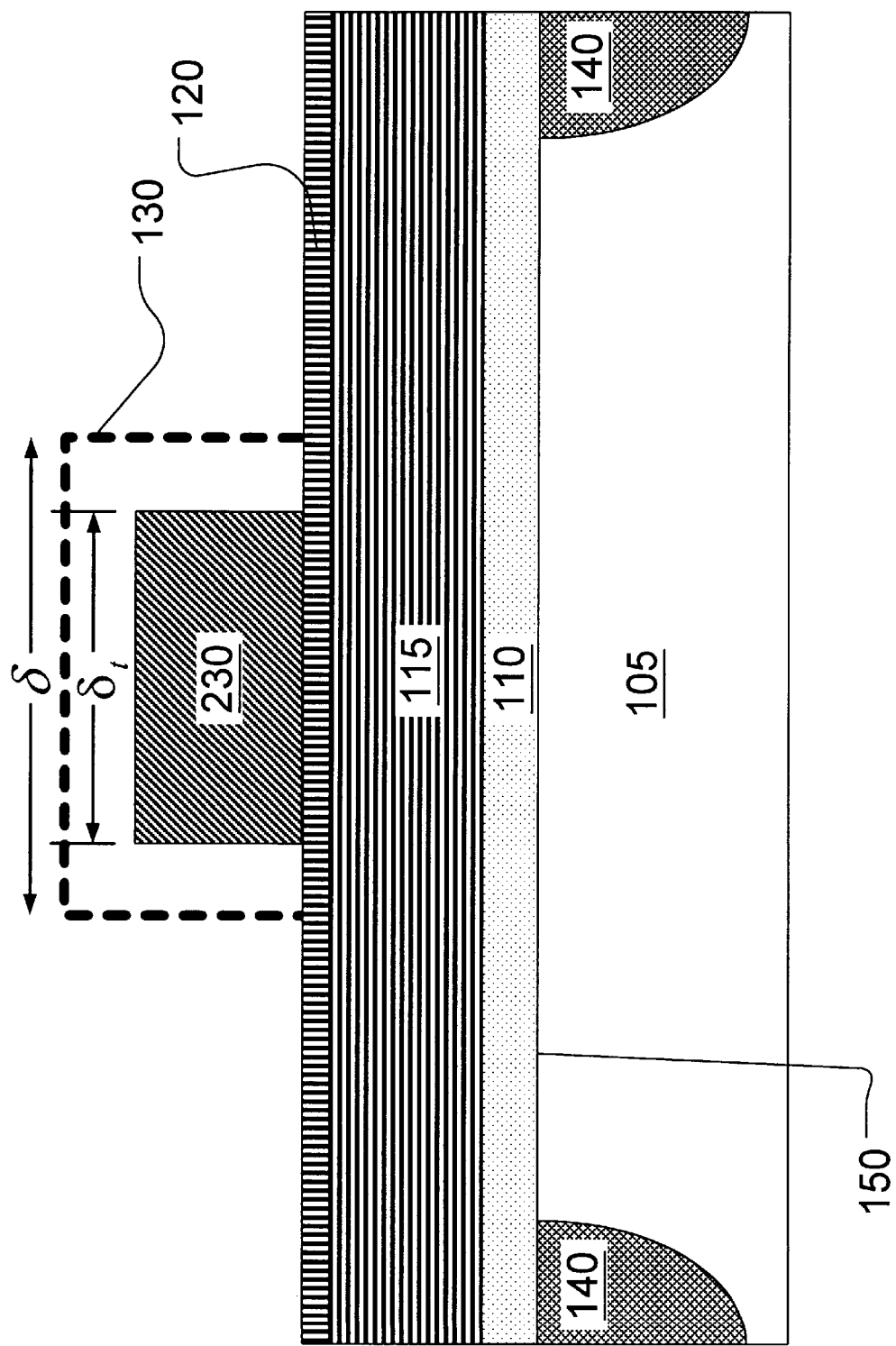

As shown in FIG. 2, the patterned photoresist mask 130 (indicated in phantom) is trimmed using a controlled photoresist trim to form a trimmed photoresist mask 230. The patterned photoresist mask 130 may be trimmed using a dry etch, for example. The trimmed photoresist mask 230 will typically have the critical dimension $\delta_t$ that may be in a range of about 800–1300 Å that will determine the size of a gate conductor 315 and a gate dielectric 310, as shown in FIG. 3.

Figure 3:
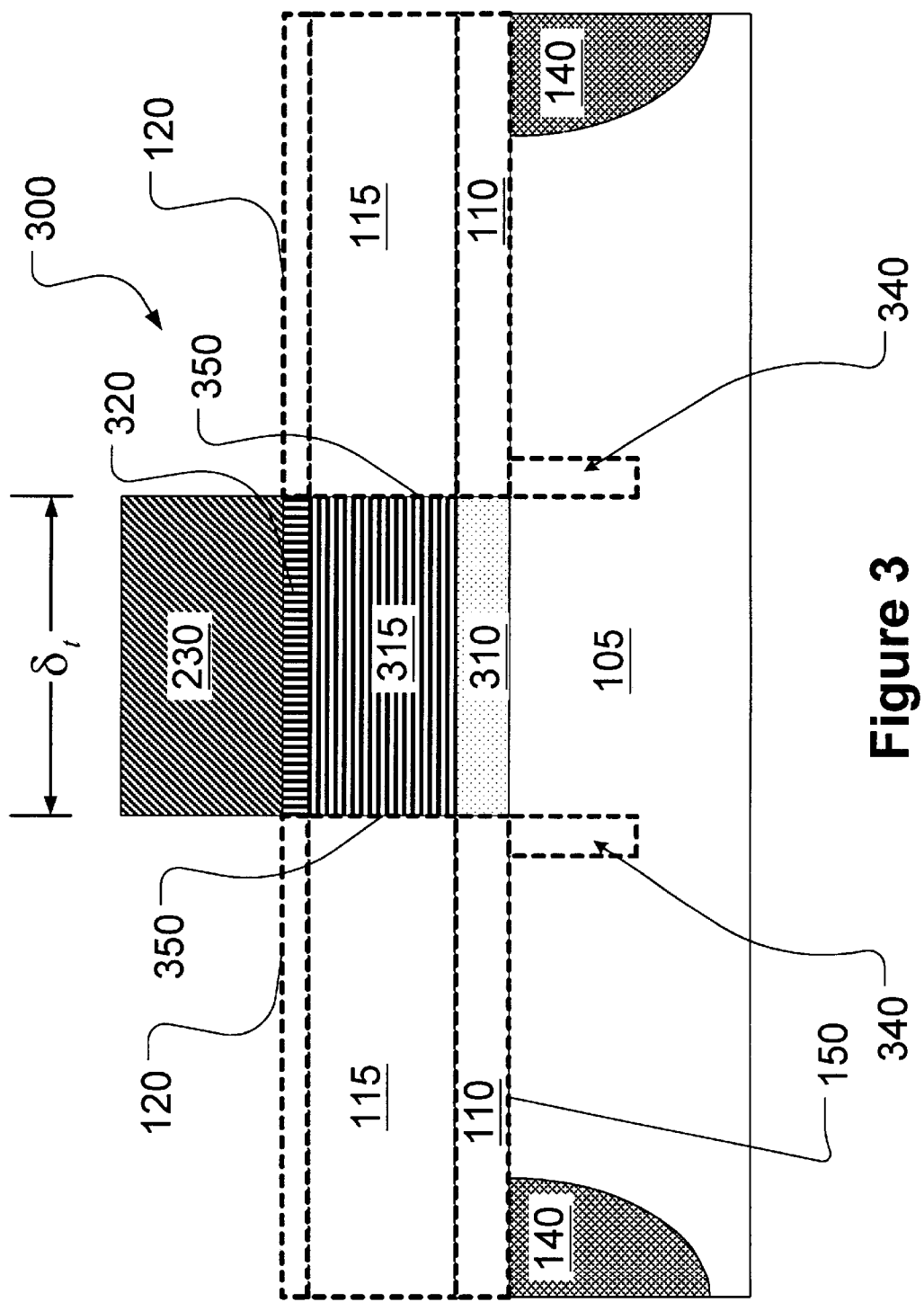
Figure 4:
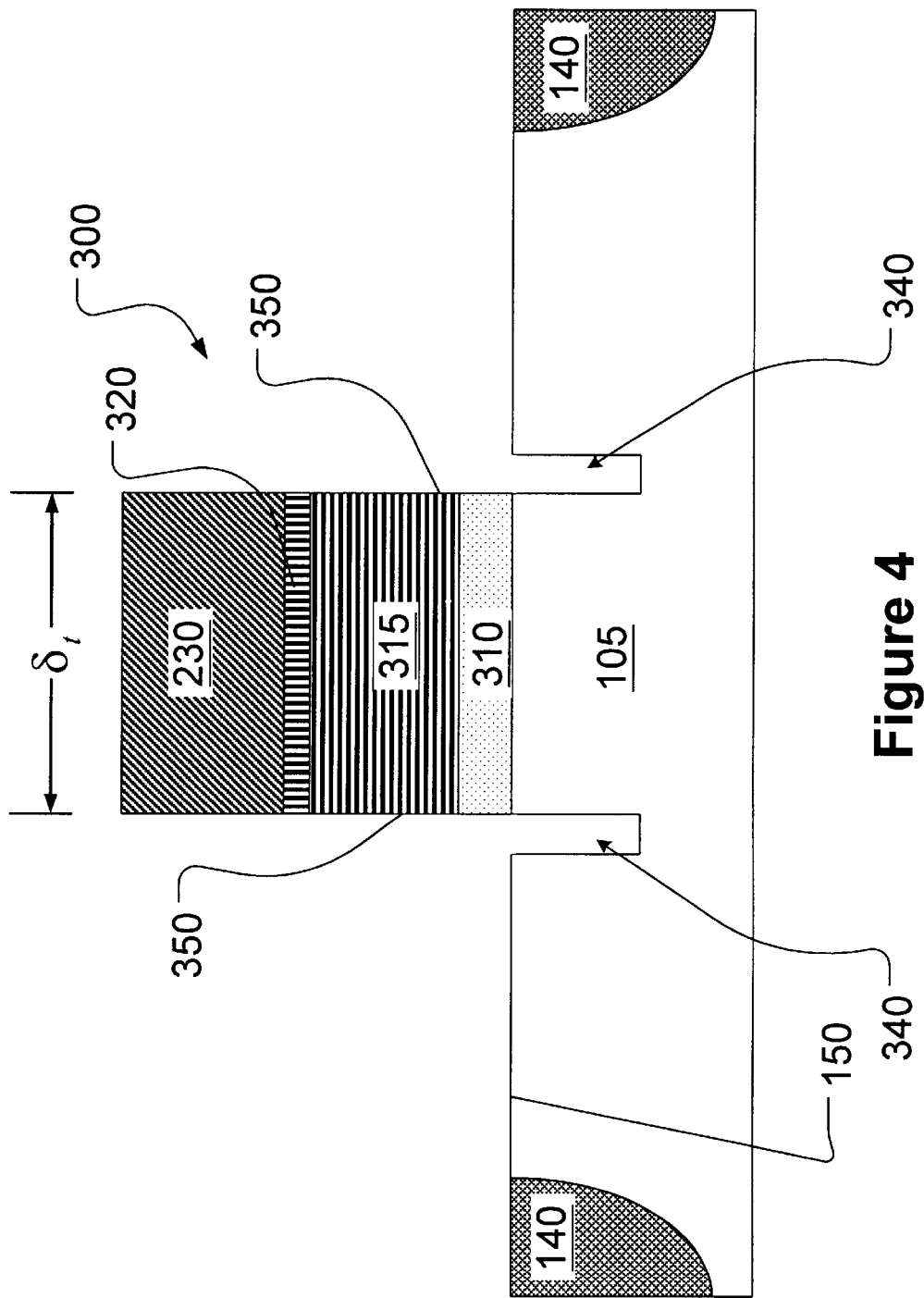

As shown in FIGS. 3–4, the trimmed photoresist mask 230 having the critical dimension $\delta_t$ is then used as a mask to form a masked gate stack 300. The masked gate stack 300 may include the trimmed photoresist mask 230, an optional antireflective coating (ARC) segment 320, the gate conductor 315, and the gate dielectric 310. The masked gate stack 300 may be formed by removing portions of the dielectric layer 110, the conductive layer 115 and the optional antireflective coating (ARC) layer 120 (shown in phantom) not protected by the trimmed photoresist mask 230, using an anisotropic etching process, for example. The masked gate stack 300 will have the critical dimension $\delta_t$ defined by the trimmed photoresist mask 230.

As shown in FIGS. 3–4, the masked gate stack 300 may be formed using a variety of known etching techniques, such as an anisotropic etching process. A selective anisotropic etching technique may be used, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used, in various illustrative embodiments.

As shown in FIGS. 3–4, an anisotropic etch enhancement occurs at edges 350 of the masked gate stack 300, and openings 340 (known as "microtrenches") may be formed adjacent the edges 350 of the masked gate stack 300. The openings 340 may have widths in a range of about 100–500 Å, and depth in a range of about 500–1500 Å.

Figure 5:
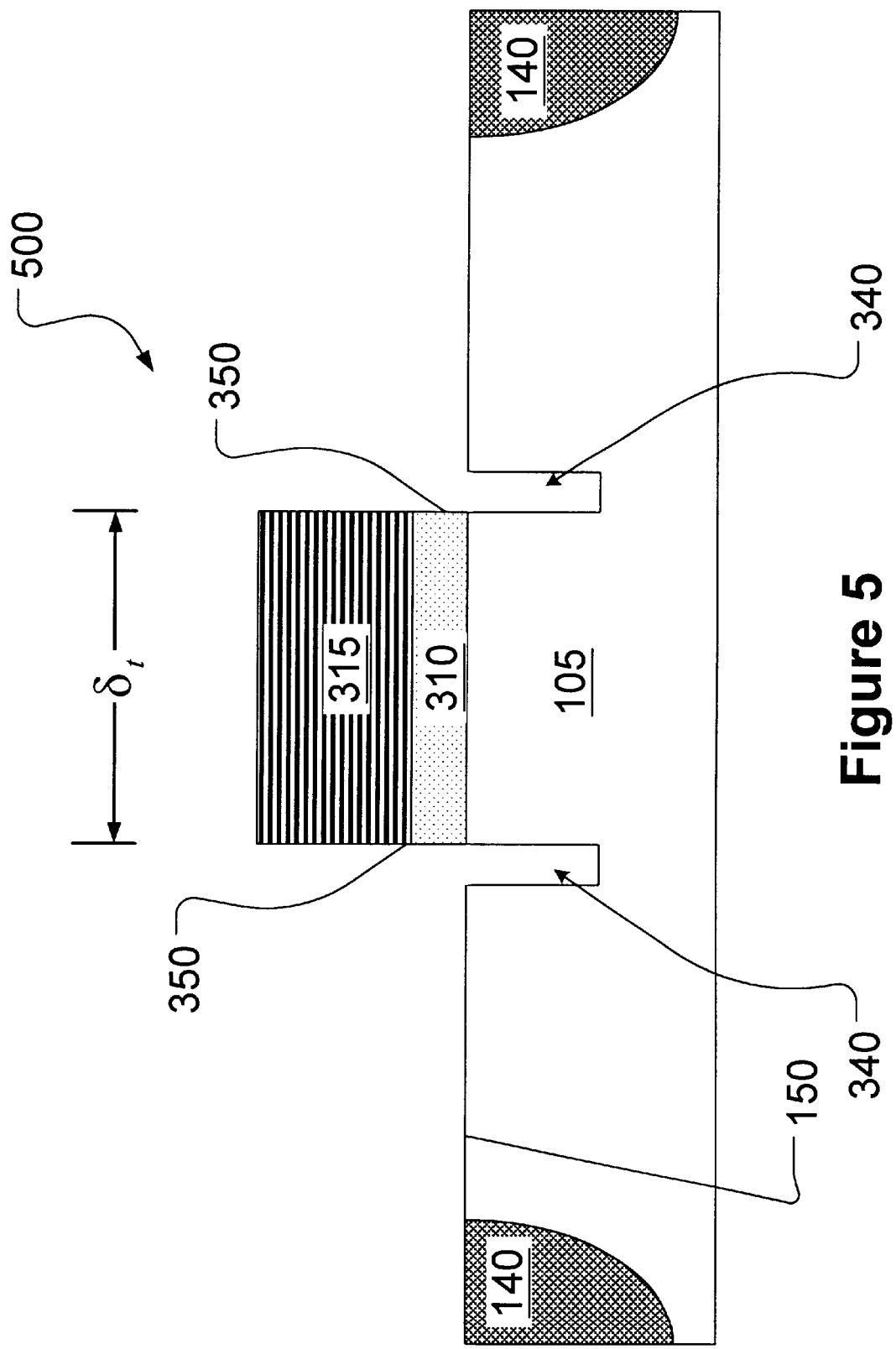

As shown in FIG. 5, the trimmed photoresist mask 230 having the critical dimension $\delta_t$ (FIGS. 2–4), and the optional antireflective coating (ARC) segment 320, may be removed, by being stripped away, by ashing, for example. Alternatively, the trimmed photoresist mask 230, and the remnant 320 of the optional antireflective coating (ARC) layer 120, may be stripped using a 1:1 solution of sulfuric acid ($H_2SO_4$) to hydrogen peroxide ($H_2O_2$), for example. The stripping away of the trimmed photoresist mask 230 forms an unmasked gate stack 500, having the edges 350. The unmasked gate stack 500 may include the gate conductor 315 and the gate dielectric 310, adjacent the openings 340.

Figure 6:
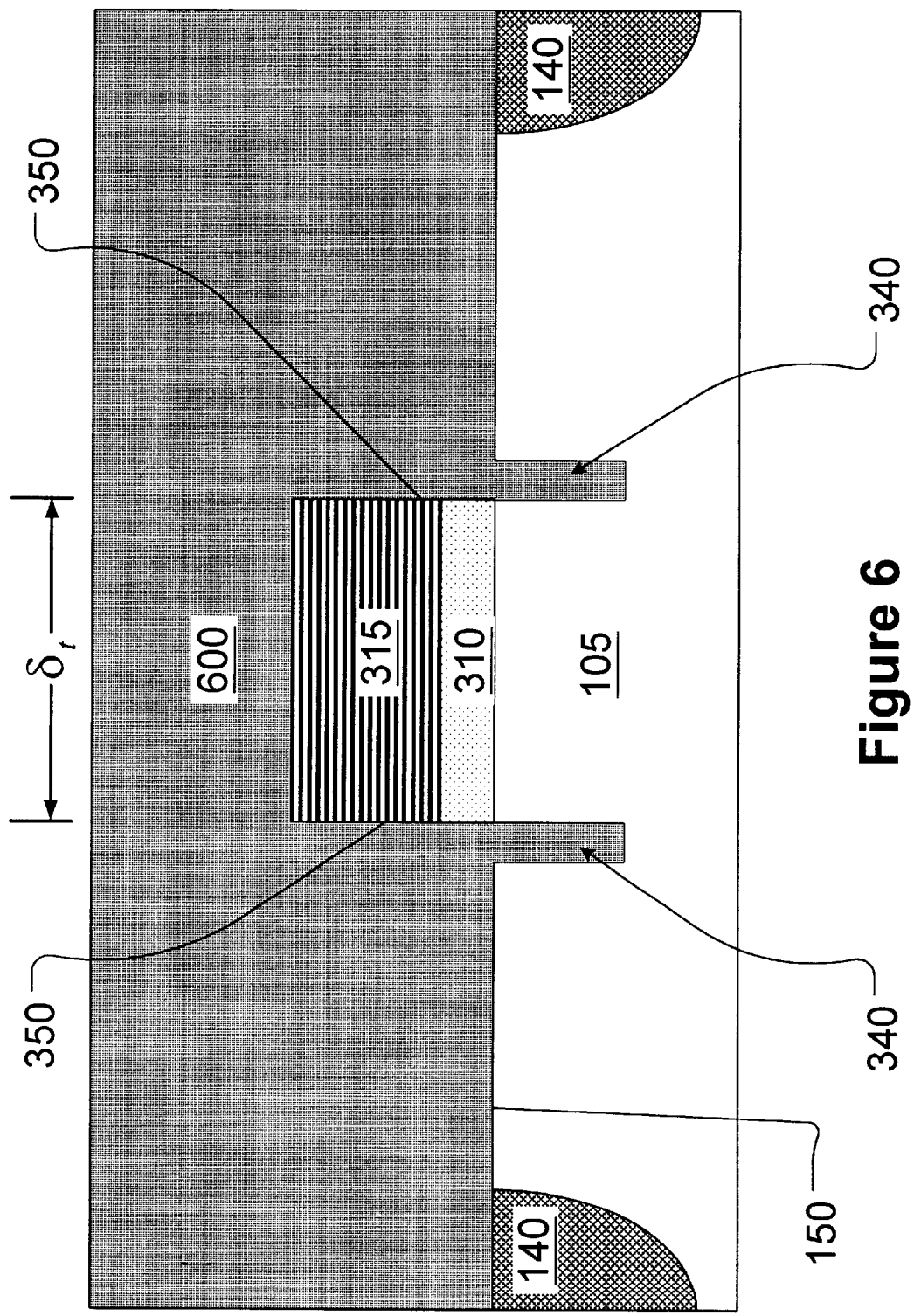

As shown in FIG. 6, a dielectric fill layer 600 may be formed above the upper surface 150 of the semiconducting substrate 105, above and adjacent the unmasked gate stack 500, and within the openings 340. The dielectric fill layer 600 may be formed by a variety of known techniques for forming such layers, e.g., chemical vapor deposition (CVD), low-pressure CVD (LPCVD), plasma-enhanced CVD (PECVD), sputtering and physical vapor deposition (PVD), thermal growing, spin-on glass, and the like.

The dielectric fill layer 600 may have a thickness above the upper surface 150 ranging from approximately 500–5000 Å, for example, and may be formed from a variety of dielectric materials. The dielectric fill layer 600 may, for example, include an oxide (e.g., Ge oxide), an oxynitride (e.g., silicon oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The dielectric fill layer 600 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the dielectric fill layer 600 may also be formed of any suitable "low dielectric constant" or "low K" dielectric material, where K is less than or equal to about 4. Examples include Applied Material's Black Diamond®, Novellus' Coral®, Allied Signal's Nanoglass®, JSR's LKD5104, and the like.

Figure 7:
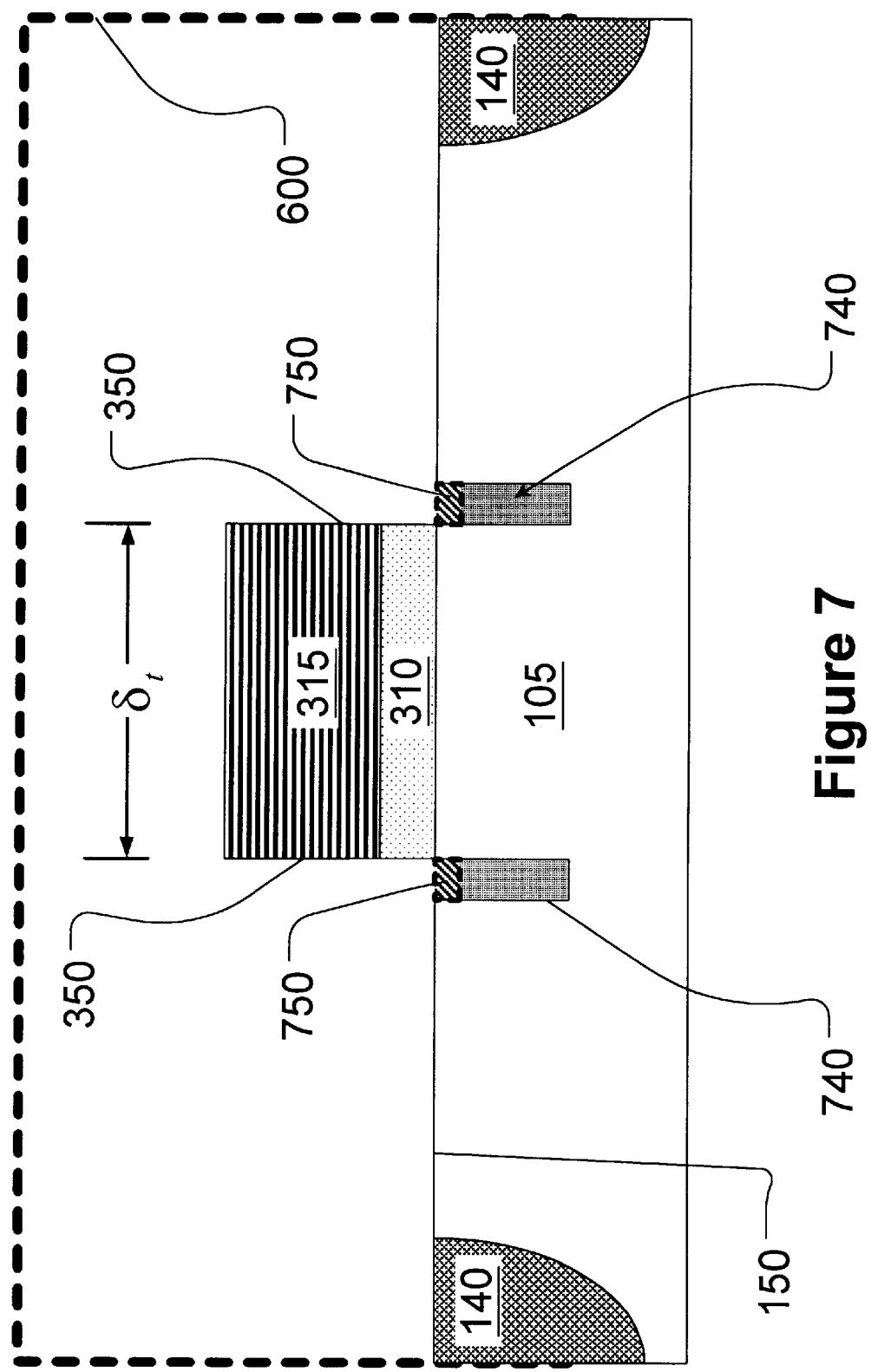

As shown in FIG. 7, dielectric isolation structures 740 may be formed by removing portions of the dielectric fill layer 600 (shown in phantom) above the upper surface 150 of the semiconducting substrate 105, and above and adjacent the unmasked gate stack 500, leaving portions of the dielectric fill layer 600 only within the openings 340. In various alternative illustrative embodiments, conducting fill material 750 (shown in phantom) comprised of polysilicon, for example, may be formed within the openings 340 and above the dielectric isolation structures 740.

The dielectric isolation structures 740 may be formed using a variety of known etching techniques, such as an anisotropic etching process. A selective anisotropic etching technique may be used, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used, in various illustrative embodiments.

In various alternative illustrative embodiments, the dielectric isolation structures 740 may be formed by leaving the openings 340 filled with air, a low K dielectric material having a dielectric constant K of about 1.0. In various other alternative illustrative embodiments, the dielectric isolation structures 740 may be formed by thermally growing silicon dioxide in the openings 340. In still other various alternative illustrative embodiments, the dielectric isolation structures 740 may be formed by implanting oxygen ($O_2$) into a silicon (Si) semiconducting substrate 105 adjacent at least one side of either the masked gate stack 300 (FIG. 3) or the unmasked gate stack 500 (FIG. 5), and converting at least a portion of the oxygen ($O_2$) and the silicon (Si) in the semiconducting substrate 105 into silicon dioxide ($SiO_2$) using a heat treatment, for example, as in a "SIMOX" process, without forming the openings 340.

Figure 8:
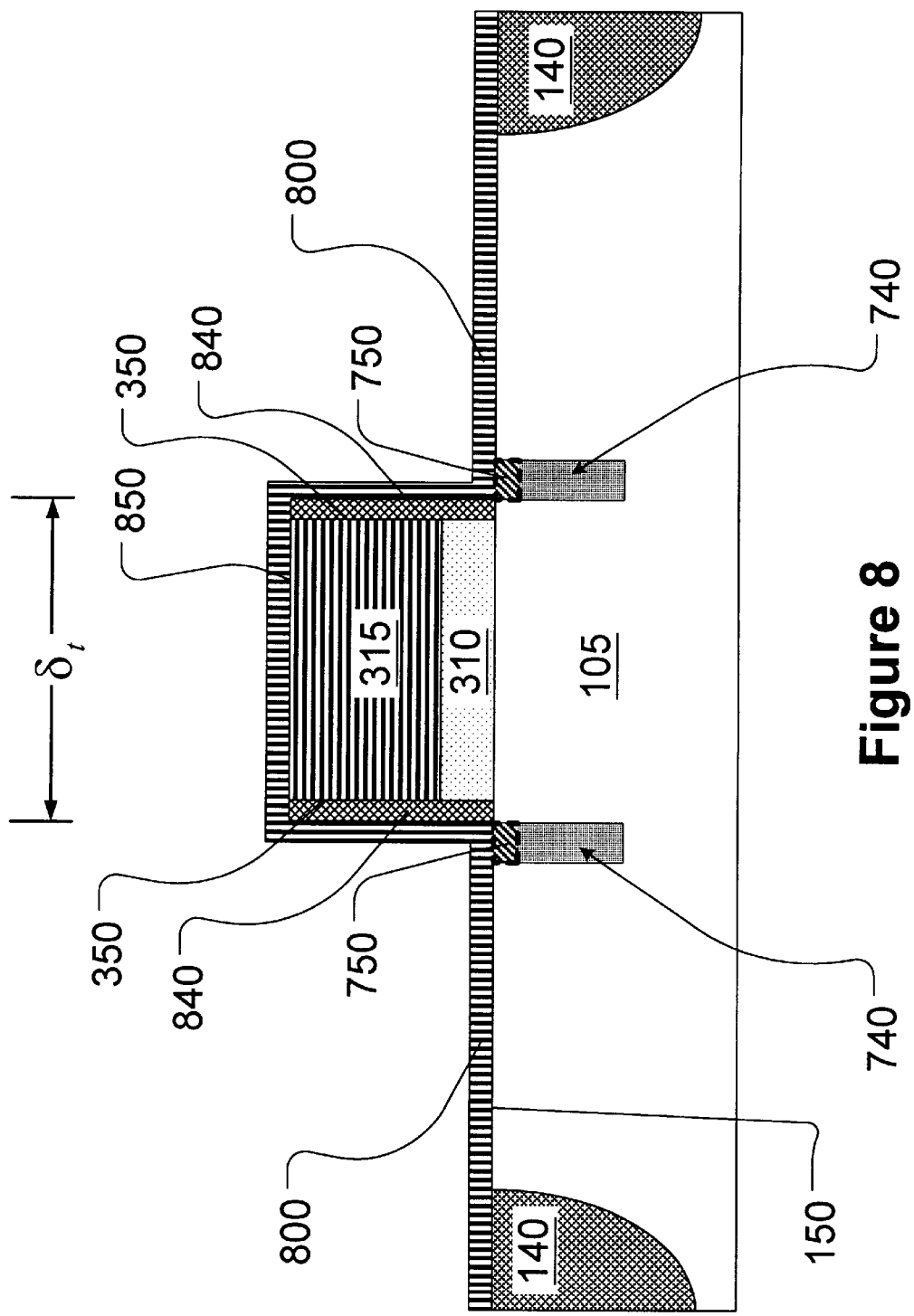
Figure 9:
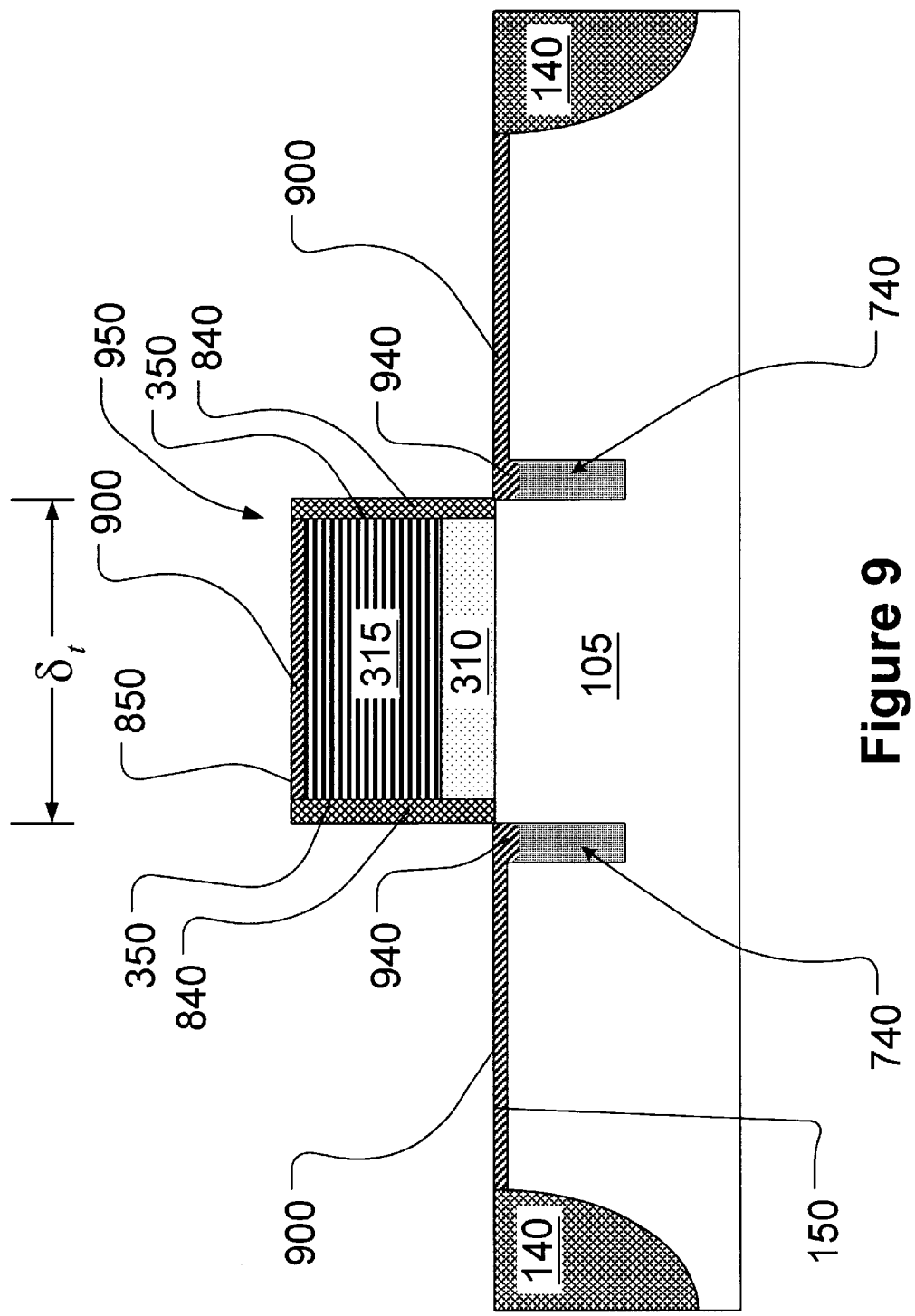

As shown in FIG. 8, dielectric spacers 840 may be formed adjacent the edges 350 of the unmasked gate stack 500. The dielectric spacers 840 may be formed of thermally grown silicon dioxide ($SiO_2$), in various illustrative embodiments. The dielectric spacers 840 may help protect the gate conductor 315 from being shorted to a subsequently formed source/drain regions 1420 (FIG. 14) by self-aligned silicided (salicided) conductive layers 900 (FIG. 9). The dielectric spacers 840 may be particularly useful for a very thin gate dielectric 310.

As shown in FIG. 8, a silicidable conductive layer 800 may be formed above the respective upper surfaces 150 and 850 of the semiconducting substrate 105 and the unmasked gate stack 500, and adjacent the dielectric spacers 840 on the edges 350 of the unmasked gate stack 500. The silicidable conductive layer 800 may be formed by a variety of known techniques, e.g., high-density ionized metal plasma (IMP) deposition, high-density inductively coupled plasma (ICP) deposition, sputtering, PVD, CVD, LPCVD, PECVD, and the like, and may have a thickness ranging from approximately 50–150 Å.

The silicidable conductive layer 800 may be formed of a variety of materials suitable to form a high-temperature-stable, thin silicide, which is able to withstand the elevated temperatures of annealing and heating, such as RTA processes used to diffuse and activate ion-implanted dopants. Such dopant-activating RTA processes may be performed at temperatures ranging from approximately 800–1100° C. for a time ranging from approximately 5–60 seconds.

The silicidable conductive layer 800 may also be formed of a variety of materials suitable to form a high-temperature-stable, thin silicide that is also stable against agglomeration. Agglomeration is believed to be the tendency of some silicides, such as titanium silicide ($TiSi_2$) and zirconium silicide ($ZrSi_2$), to try to minimize their surface areas at high temperatures by balling up and forming spheres that increase the resistance of the agglomerated silicides. The silicidable conductive layer 800 may be formed by blanket-depositing refractory metals such as tungsten (W), molybdenum (Mo), cobalt (Co), and the like, above the respective upper surfaces 150 and 850 of the semiconducting substrate 105 and the unmasked gate stack 500, and adjacent the dielectric spacers 840 on the edges 350 of the unmasked gate stack 500.

As shown in FIG. 9, the silicidable conductive layer 800 may then be subjected to a self-aligned silicidation (salicidation) process to render the respective upper surfaces 150 and 850 of the semiconducting substrate 105 and the unmasked gate stack 500 more conductive, for example. In particular, self-aligned silicided (salicided) conductive layers 900 are formed only at the respective upper surfaces 150 and 850 of the semiconducting substrate 105 and the unmasked gate stack 500, forming a salicided gate stack 950. Silicide bridge portions 940 may be formed above the dielectric isolation structures 740 to form a conductive bridge in the silicon (Si) semiconducting substrate 105 above the dielectric isolation structures 740. In various alternative illustrative embodiments, the silicide bridge portions 940 may be formed in part using some or all of the conducting fill material 750 (shown in phantom in FIGS. 7 and 8) above the dielectric isolation structures 740.

The silicidable conductive layer 800 may be subjected to the first step of a two-step heat-treating process to begin converting the silicidable conductive layer 800 into a metal silicide. For example, the first step of the two-step heat-treating process may be an RTA process performed at a temperature ranging from approximately 450–800° C. for a time ranging from approximately 15–60 seconds. It is believed that only portions of the doped-poly gate conductor 315 and the semiconducting substrate 105 below the respective upper surfaces 150 and 850 would be consumed to form the metal silicide of the salicided conductive layers 900. It is further believed that silicide will not form adjacent the dielectric spacers 840 on the edges 350 of the unmasked gate stack 500, facilitating the self-alignment of the salicidization process.

Figure 14:
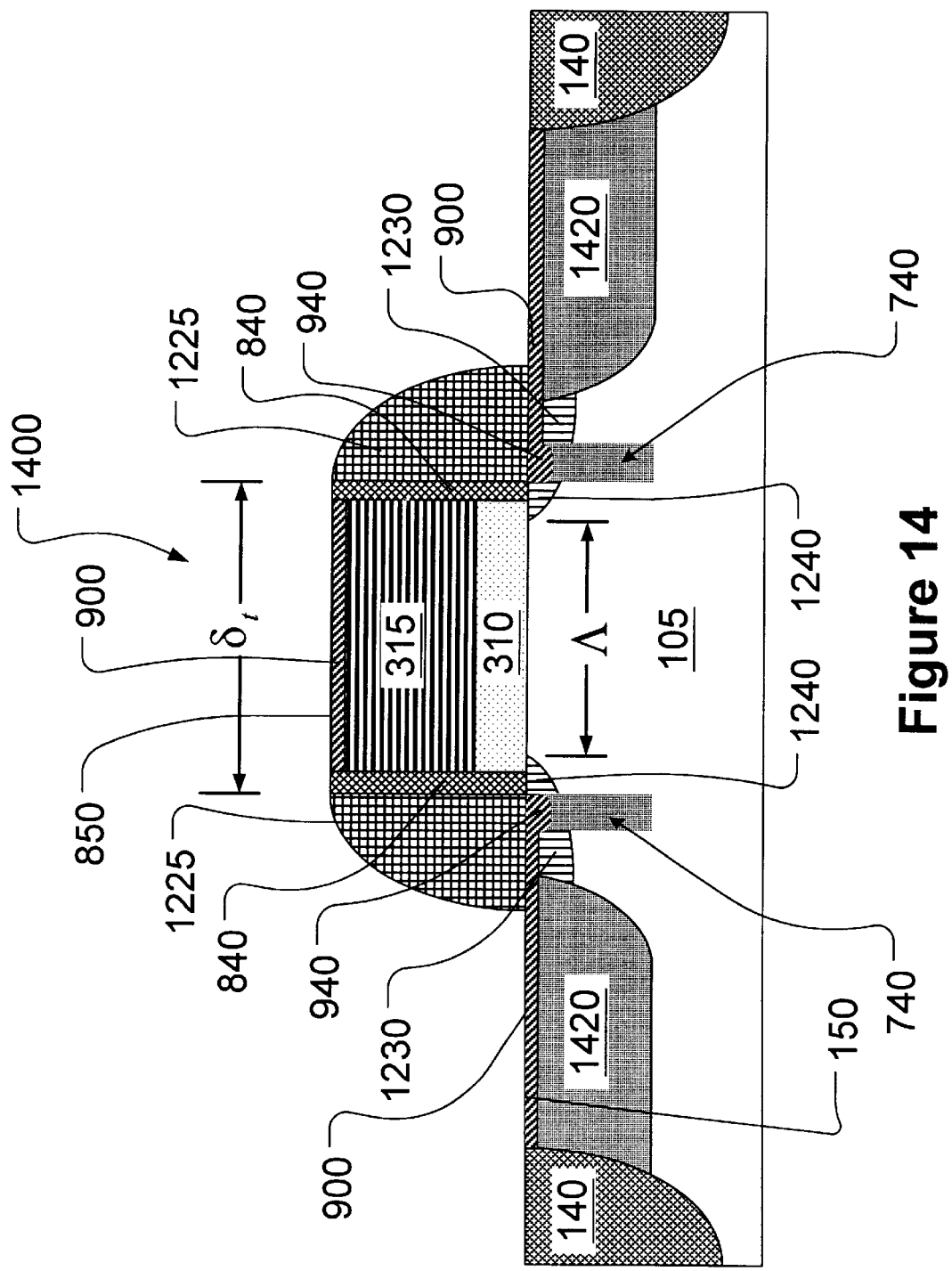

Unsilicided material in the silicidable conductive layer 800, particularly adjacent the portions of the edges 350 adjacent the gate dielectric 310, may be removed by a cleaning and/or a wet chemical stripping, for example. It is believed that some of the unsilicided material in portions of the silicidable conductive layer 800 above the dielectric isolation structures 740 will not be removed by the cleaning and/or a wet chemical stripping, for example. The silicide bridge portions 940 of the salicided conductive layers 900 may be formed from the unsilicided material of the silicidable conductive layer 800 above the dielectric isolation structures 740 that is not be removed by the cleaning and/or a wet chemical stripping. Thereafter, the remaining silicided material may be subjected to the second step of the two-step heat-treating process to finish converting the remaining portions of the silicidable conductive layer 800 into the metal silicide of the salicided conductive layers 900. The salicidization process renders the doped-poly gate 315 and later-formed $N^-$-doped ($P^-$-doped) source/drain extension (SDE) regions 1230 (described more fully below with reference to FIG. 12) of the silicon (Si) semiconducting substrate 105 more conductive by providing the salicided conductive layers 900, lowering the overall resistivity of the MOS transistor 1400 (FIG. 14).

Figure 10:
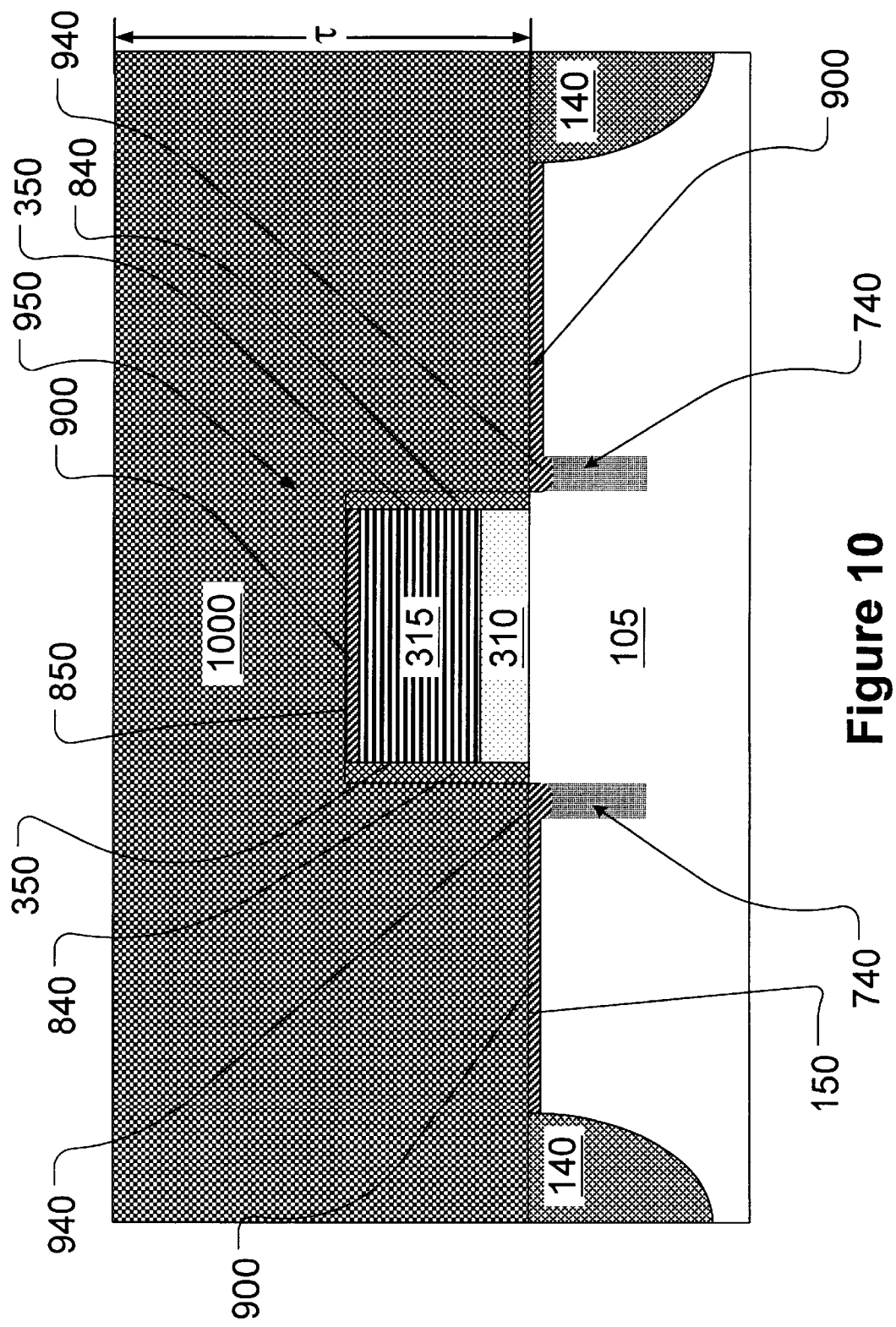

As shown in FIG. 10, a masking layer 1000, formed of photoresist, for example, may be formed above the upper surface 150 of the semiconducting substrate 105, and above and adjacent the salicided gate stack 950. The masking layer 1000 may have a thickness τ above the upper surface 150 ranging from approximately 500–5000 Å, for example. In various illustrative embodiments, the thickness τ above the upper surface 150 is about 5000 Å. In various alternative illustrative embodiments, the thicknessτ above the upper surface 150 ranges from approximately 500–1000 Å.

Figure 11:
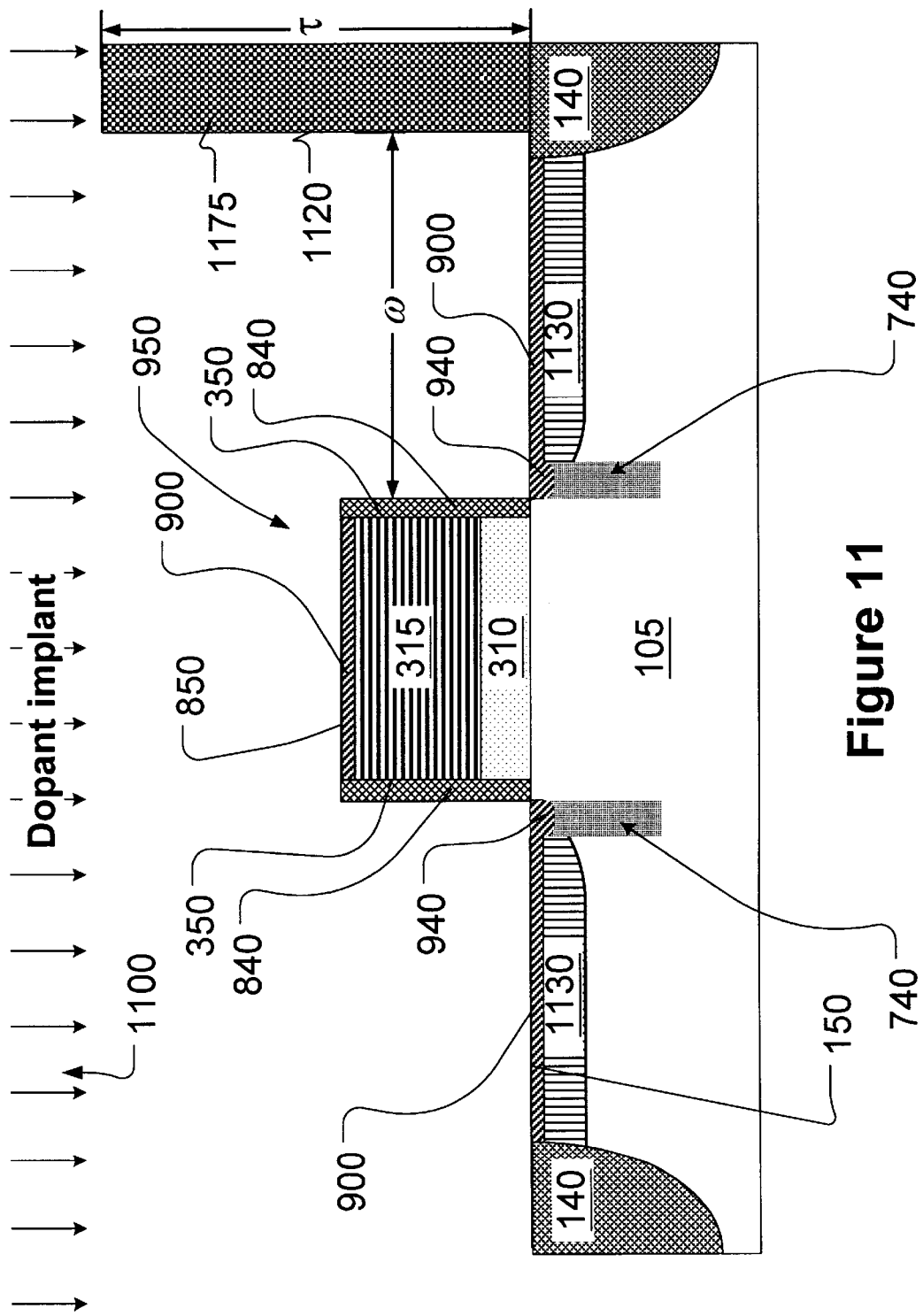

As shown in FIG. 11, the masking layer 1000 may be patterned to form a mask 1175 above at least a portion of the shallow trench isolation (STI) 140. The masking layer 1000 may be patterned to form the mask 1175 using a variety of known photolithography and/or etching techniques. The mask 1175 may have an edge 1120 spaced apart from the edge 350 of the salicided gate stack 950 by a distance ω ranging from approximately 1000–1500 Å, for example.

The mask 1175 may be formed over the STI region 140, as in conventional CMOS fabrication methods, to protect the PMOS (NMOS) transistor regions while the NMOS (PMOS) transistor regions are being implanted to form $N^-$-doped ($P^-$-doped) regions 1130, for example. As shown in FIG. 11, a dopant 1100 (indicated by the arrows) may be implanted to introduce dopant atoms and/or molecules into the semiconducting substrate 105 to form the $N^-$-doped ($P^-$-doped) regions 1130. After activation, the $N^-$-doped ($P^-$-doped) regions 1130 become the $N^-$-doped ($P^-$-doped) source/drain extension (SDE) regions 1230 (as described more fully below with reference to FIG. 12).

Figure 12:
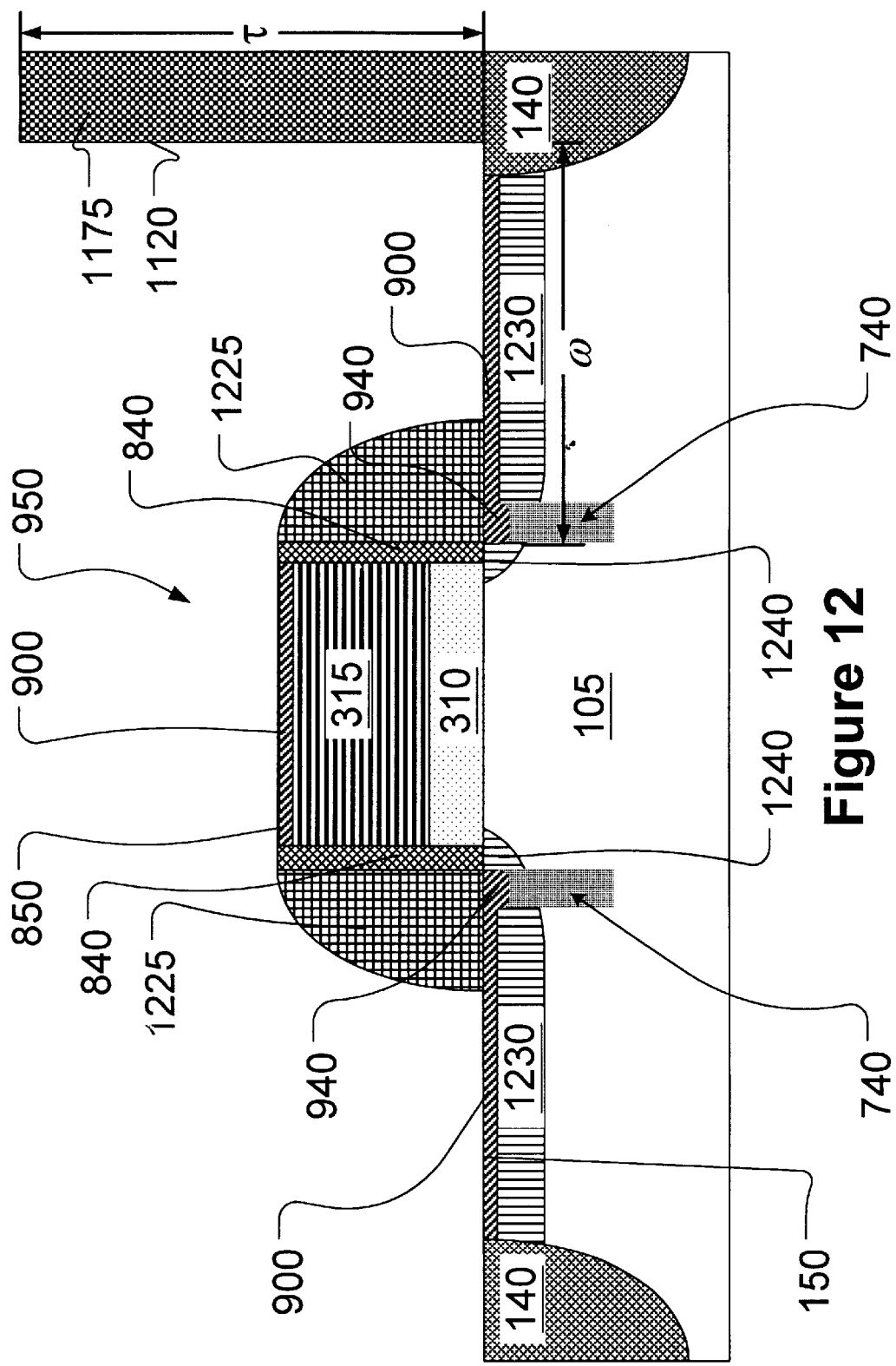

In various illustrative embodiments, the $N^-$-doped ($P^-$-doped) regions 1130 may be formed by being implanted with a source/drain extension (SDE) dose of As (for $N^-$-doping appropriate for an NMOS transistor 1400, FIG. 14) or $BF_2$ (for $P^-$-doping appropriate for a PMOS transistor 1400, FIG. 14). The source/drain extension (SDE) dose may range from about $1.0 \times 10^{14}$–$1.0 \times 10^{15}$ ions/cm$^2$ at an implant energy ranging from about 3–50 keV. The N$^-$-doped (P$^-$-doped) regions 1130 may be subjected to an RTA process performed at a temperature ranging from approximately 800–1100° C. for a time ranging from approximately 5–60 seconds. The RTA process may activate the implant and form a more sharply defined and less graded activated implant junction with the substrate 105 than would an RTA process following an implant with a source/drain extension (SDE) dose of more mobile P (for N$^-$-doping appropriate for an NMOS transistor 1400) or B (for P$^-$-doping appropriate for a PMOS transistor 1400). As shown in FIG. 12, in various illustrative embodiments, it is believed that activated implant portions 1240 of the N$^-$-doped (P$^-$-doped) source/drain extension (SDE) regions 1230 will extend through the silicide bridge portions 940 below the salicided gate stack 950. In various illustrative alternative embodiments (not shown), the activated implant portions 1240 of the N$^-$-doped (P$^-$-doped) source/drain extension (SDE) regions 1230, extending through the silicide bridge portions 940 below the salicided gate stack 950, are absent.

As shown in FIG. 12, dielectric spacers 1225 may be formed adjacent the salicided gate stack 950, either before or after the N$^-$-doped (P$^-$-doped) regions 1130 are activated to become the N$^-$-doped (P$^-$-doped) source/drain extension (SDE) regions 1230. As shown in FIG. 12, dielectric spacers 1225 may be formed by a variety of techniques above the N$^-$-doped (P$^-$-doped) source/drain extension (SDE) regions 1230 and adjacent the salicided gate stack 950. For example, the dielectric spacers 1225 may be formed by depositing a conformal layer (not shown) of the appropriate material above and adjacent the salicided gate stack 950, and then performing an anisotropic RIE process on the conformally blanket-deposited layer. The dielectric spacers 1225 may each have a base thickness ranging from approximately 300–1500 Å, for example, measured from the edges 350 of the salicided gate stack 950.

The dielectric spacers 1225, like the gate dielectric 310, may be formed from a variety of dielectric materials and may, for example, be an oxide (e.g., Ge oxide), a nitride (e.g., GaAs nitride), an oxynitride (e.g., silicon oxynitride), silicon dioxide (SiO$_2$), nitrogen-bearing SiO$_2$, silicon nitride (Si$_3$N$_4$), silicon oxynitride (Si$_x$O$_y$N$_z$), and the like. The dielectric spacers 1225 may also be formed of any suitable "low dielectric constant" or "low K" material, where K is less than or equal to about 4. Examples include Applied Material's Black Diamond®, Novellus' Coral®, Allied Signal's Nanoglass®, JSR's LKD5104, and the like. Additionally, the dielectric spacers 1225 may be comprised of a fluorine-doped oxide, a fluorine-doped nitride, a fluorine-doped oxynitride, a fluorine-doped low K material, and the like. In one illustrative embodiment, the dielectric spacers 1225 are comprised of SiO$_2$, having a base thickness of approximately 300 Å.

Figure 13:
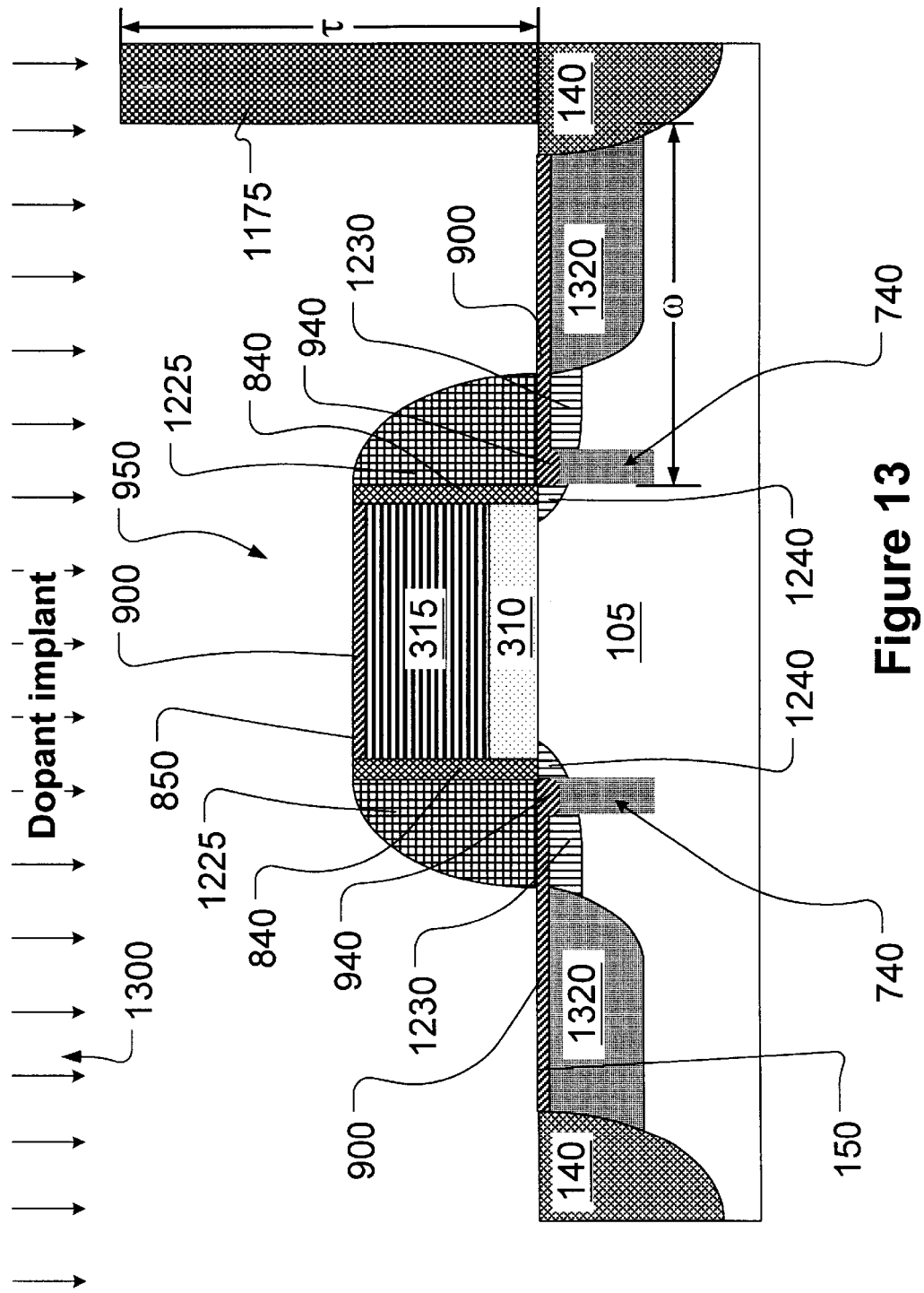

As shown in FIGS. 13–14, a dopant 1300 (indicated by arrows) may be implanted to introduce dopant atoms and/or molecules into the semiconducting substrate 105 to form N$^+$-doped (P$^+$-doped) regions 1320. After activation, the N$^+$-doped (P$^+$-doped) regions 1320 become N$^+$-doped (P$^+$-doped) source/drain regions 1420 (FIG. 14). In one illustrative embodiment, a dose of the dopant 1300 atoms and/or molecules may range from approximately $1.0 \times 10^{15}$–$5.0 \times 10^{15}$ ions/cm$^2$ of the appropriate dopant 1300 atoms and/or molecules, e.g., P for an illustrative NMOS transistor or B for an illustrative PMOS transistor. An implant energy of the dopant 1300 atoms and/or molecules may range from approximately 30–100 keV. In another illustrative embodiment, a dose of the dopant 1300 atoms is approximately $1.0 \times 10^{15}$ ions/cm$^2$ of P for an NMOS transistor or B for a PMOS transistor at an implant energy of approximately 30 keV.

The dopant 1300 may be an N$^+$ implant such as P, As, antimony (Sb), bismuth (Bi), and the like, and may form heavily doped N$^+$ source/drain regions 1420, as shown in FIG. 14. An N$^+$ implant would be appropriate for the fabrication of an NMOS transistor 1400, for example. Alternatively, the dopant 1300 may be a P$^+$ implant such as B, boron fluoride (BF, BF$_2$), aluminum (Al), gallium (Ga), Indium (In), Thallium (Tl), and the like, and may form heavily doped P$^+$ source/drain regions 1420. A P$^+$ implant would be appropriate for the fabrication of a PMOS transistor 1400, for example.

As shown in FIGS. 13–14, the N$^+$-doped (P$^+$-doped) regions 1320 may be subjected to an RTA process performed at a temperature ranging from approximately 800–1100° C. for a time ranging from approximately 5–60 seconds to form the N$^+$-doped (P$^+$-doped) source/drain regions 1420. The RTA process may activate the implant of the more mobile P (for N$^+$-doping appropriate for an NMOS transistor 1400) or B (for P$^+$-doping appropriate for a PMOS transistor 1400) and form a less sharply defined and more graded activated implant junction with the structure 105 than would an RTA process following an implant with a source/drain dose of less mobile As (for N$^+$-doping appropriate for an NMOS transistor 1400) or BF$_2$ (for P$^+$-doping appropriate for a PMOS transistor 1400).

Alternatively, an RTA process to diffuse and activate the N$^+$-doped (P$^+$-doped) regions 1320 to form the N$^+$-doped (P$^+$-doped) source/drain regions 1420 may be performed in conjunction with a self-aligned silicidation (salicidation) process (not shown), either prior to, during or following the salicidation. Such a salicidation-conjoined RTA process may be performed at a temperature ranging from approximately 800–1000° C. for a time ranging from approximately 10–60 seconds.

As shown in FIG. 14, for the transistor 1400, the distance between the dielectric spacers 1225 is substantially equal to the critical dimension $\delta_r$. The channel length for the transistor 1400 is labeled Λ.

Any of the above-disclosed embodiments of a semiconductor device, and a method of manufacturing semiconductor devices, according to the present invention, enables improved semiconductor device performance by separating and isolating a channel region of the semiconductor device from active areas of the semiconductor device, consistently, robustly and reproducibly, and in a self-aligned manner. Any of the above-disclosed embodiments of a semiconductor device, and a method of manufacturing semiconductor devices, according to the present invention, enables deeper source/drain regions to be formed in an MOS transistor, decreasing series resistance, without increasing short-channel effects and source/drain current leakage, by channeling the source/drain current above at least one dielectric isolation structure. Any of the above-disclosed embodiments of a semiconductor device, and a method of manufacturing semiconductor devices, according to the present invention, also provides for increased operating speed and improved efficiency of the semiconductor device.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A semiconductor device comprising:
   a gate dielectric positioned above a substrate layer;
   a gate conductor positioned above the gate dielectric;
   at least one dielectric isolation structure positioned in the substrate adjacent the gate dielectric; and
   at least one conductive bridge positioned substantially above the at least one dielectric isolation structure.

2. The semiconductor device of claim 1, wherein the gate dielectric includes at least one of an oxide, an oxynitride, silicon dioxide, a nitrogen-bearing oxide, a nitrogen-doped oxide, silicon oxynitride, a high dielectric constant (high K), where K is at least about 8, titanium oxide, tantalum oxide, barium strontium titanate.

3. The semiconductor device of claim 1, wherein the gate dielectric is formed by using at least one of chemical vapor deposition (CVD), low-pressure CVD (LPCVD), plasma-enhanced CVD (PECVD), sputtering, physical vapor deposition (PVD), and thermal growing.

4. The semiconductor device of claim 1, wherein the gate dielectric has an equivalent oxide thickness $t_{ox-eq}$ ranging from approximately 10–100 Å.

5. The semiconductor device of claim 1, wherein the gate conductor includes at least one of doped-poly, aluminum (Al), titanium (Ti), zirconium (Zr), tungsten (W), tantalum (Ta), nickel (Ni), molybdenum (Mo), and cobalt (Co).

6. The semiconductor device of claim 1, wherein the gate conductor is formed using at least one of chemical vapor deposition (CVD), low-pressure CVD (LPCVD), plasma-enhanced CVD (PECVD), sputtering, physical vapor deposition (PVD), high-density ionized metal plasma (IMP) deposition, and high-density inductively coupled plasma (ICP) deposition.

7. The semiconductor device of claim 1, wherein the at least one dielectric isolation structure includes at least one of an oxide, an oxynitride, silicon dioxide, silicon nitride, a nitrogen-bearing oxide, a nitrogen-doped oxide, silicon oxynitride, a high dielectric constant (high K) material, where K is at least about 8, titanium oxide, tantalum oxide, barium strontium titanate, and a low dielectric constant (low K) material, where K is at most about 4.

8. The semiconductor device of claim 7, wherein the at least one dielectric isolation structure is formed using at least one of chemical vapor deposition (CVD), low-pressure CVD (LPCVD), plasma-enhanced CVD (PECVD), sputtering, physical vapor deposition (PVD), spin-on glass, and thermal growing.

9. The semiconductor device of claim 1, wherein the substrate includes silicon, and the at least one dielectric isolation structure is formed of silicon dioxide formed by introducing oxygen into the substrate adjacent the gate dielectric and converting at least a portion of the oxygen and the silicon in the substrate into silicon dioxide using a heat treatment.

10. The semiconductor device of claim 1, wherein said at least one conductive bridge comprises a metal silicide.

11. The semiconductor device of claim 10, wherein said at least one conductive bridge comprises at least one of tungsten silicide, molybdenum silicide, and cobalt silicide.

12. The semiconductor device of claim 1, wherein said semiconductor device comprises two dielectric isolation structures adjacent the gate dielectric and on opposing sides of the gate dielectric.

13. The semiconductor device of claim 1, wherein said semiconductor device comprises two conductive bridges each of which is positioned substantially above the two dielectric isolation structures.

14. A semiconductor device comprising:
    a gate dielectric positioned above a substrate layer;
    a gate conductor positioned above the gate dielectric;
    at least one dielectric isolation structure comprised of silicon dioxide positioned in the substrate adjacent the gate dielectric; and
    at least one conductive bridge comprised of a metal silicide positioned substantially above the at least one dielectric isolation structure.

15. The semiconductor device of claim 14, wherein the gate dielectric includes at least one of an oxide, an oxynitride, silicon dioxide, a nitrogen-bearing oxide, a nitrogen-doped oxide, silicon oxynitride, a high dielectric constant (high K), where K is at least about 8, titanium oxide, tantalum oxide, barium strontium titanate.

16. The semiconductor device of claim 14, wherein the gate dielectric is formed by using at least one of chemical vapor deposition (CVD), low-pressure CVD (LPCVD), plasma-enhanced CVD (PECVD), sputtering, physical vapor deposition (PVD), and thermal growing.

17. The semiconductor device of claim 14, wherein the gate dielectric has an equivalent oxide thickness $t_{ox-eq}$ ranging from approximately 10–100 Å.

18. The semiconductor device of claim 14, wherein the gate conductor includes at least one of doped-poly, aluminum (Al), titanium (Ti), zirconium (Zr), tungsten (W), tantalum (Ta), nickel (Ni), molybdenum (Mo), and cobalt (Co).

19. The semiconductor device of claim 14, wherein the gate conductor is formed using at least one of chemical vapor deposition (CVD), low-pressure CVD (LPCVD), plasma-enhanced CVD (PECVD), sputtering, physical vapor deposition (PVD), high-density ionized metal plasma (IMP) deposition, and high-density inductively coupled plasma (ICP) deposition.

20. The semiconductor device of claim 14, wherein the at least one dielectric isolation structure is formed by introducing oxygen into the substrate adjacent the gate dielectric and converting at least a portion of the oxygen and the silicon in the substrate into silicon dioxide using a heat treatment.

21. The semiconductor device of claim 14, wherein said at least one conductive bridge comprises at least one of tungsten silicide, molybdenum silicide, and cobalt silicide.

22. The semiconductor device of claim 14, wherein said semiconductor device comprises two dielectric isolation structures adjacent the gate dielectric and on opposing sides of the gate dielectric.

23. The semiconductor device of claim 14, wherein said semiconductor device comprises two conductive bridges each of which is positioned substantially above the two dielectric isolation structures.

24. A semiconductor device comprising:
    a gate dielectric positioned above a substrate layer;
    a gate conductor positioned above the gate dielectric;

a first and a second dielectric isolation structure comprised of silicon dioxide positioned in the substrate adjacent the gate dielectric, wherein the first and the second dielectric structure are positioned on opposing sides of the gate dielectric; and a first and a second conductive bridge comprised of a metal silicide, wherein the first and the second conductive bridges are positioned substantially above the first and the second dielectric isolation structures, respectively.

25. The semiconductor device of claim 24, wherein the first and the second dielectric isolation structures are each formed by introducing oxygen into the substrate adjacent the gate dielectric and converting at least a portion of the oxygen and the silicon in the substrate into silicon dioxide using a heat treatment.

26. The semiconductor device of claim 24, wherein said first and second conductive bridges comprise at least one of tungsten silicide, molybdenum silicide, and cobalt silicide.

* * * * *